United States Patent
Shu et al.

(10) Patent No.: US 7,205,075 B2
(45) Date of Patent: Apr. 17, 2007

(54) METHOD OF FORMING A VERTICAL MEMORY DEVICE WITH A RECTANGULAR TRENCH

(75) Inventors: Yu-Sheng Shu, Taoyuan (TW); Yuan-Hsun Wu, Taoyuan Hsien (TW); Chung-Yuan Lee, Taoyuan (TW); Shian-Jyh Lin, Chiayi Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 273 days.

(21) Appl. No.: 10/448,675

(22) Filed: May 29, 2003

(65) Prior Publication Data
US 2004/0076893 A1    Apr. 22, 2004

(30) Foreign Application Priority Data
Oct. 21, 2002    (TW)    ............................... 91124265 A

(51) Int. Cl.
*G03F 1/00*    (2006.01)
(52) U.S. Cl. .......................................................... 430/5
(58) Field of Classification Search .................... 430/5, 430/322–324, 311–313
See application file for complete search history.

(56) References Cited

U.S. PATENT DOCUMENTS

| | | | | |
|---|---|---|---|---|
| 5,437,947 A | * | 8/1995 | Hur et al. ....................... | 430/5 |
| 5,876,878 A | * | 3/1999 | Pierrat et al. .................. | 430/5 |
| 6,444,524 B1 | * | 9/2002 | Chung et al. ............... | 438/259 |
| 6,582,260 B2 | * | 6/2003 | Nemoto et al. .............. | 440/77 |

* cited by examiner

*Primary Examiner*—S. Rosasco
(74) *Attorney, Agent, or Firm*—Quintero Law Office

(57) ABSTRACT

A method of forming a vertical memory device with a rectangular trench. First, a substrate covered by a photoresist layer is provided. Next, the photoresist layer is defined by a mask to form a rectangular opening, wherein the mask has two rectangular transparent patterns arranged with a predetermined interval. Next, the substrate is etched using the defined photoresist layer as a mask to form a single rectangular trench and the photoresist layer is then removed. Finally, a trench capacitor and a vertical transistor are successively formed in the rectangular trench to finish the vertical memory device.

5 Claims, 5 Drawing Sheets

METHOD OF FORMING A VERTICAL MEMORY DEVICE WITH A RECTANGULAR TRENCH

BACKGROUND OF THE INVENTION

1. Field of the Invention

The invention relates to lithography, and more particularly to a mask for defining a rectangular trench and a method of forming a vertical memory device with a rectangular trench by the mask to improve the threshold voltage of transistor shift and increase the alignment process window.

2. Description of the Related Art

With the wide application of integrated circuits (ICs), several kinds of semiconductor devices with higher efficiency and lower cost are produced based on different objectives. Dynamic random access memory (DRAM) is such an important semiconductor device in the information and electronics industry.

Most DRAMs presently have one transistor and one capacitor in one DRAM cell. Under increased integration, it is needed to shrink the size of the memory cell so as to manufacture the DRAM with higher memory capacity and higher processing speed. A 3-D capacitor structure can reduce its occupation area in the semiconductor substrate, so the 3-D capacitor, such as a deep trench capacitor, is applied to the fabrication of DRAM of 64 megabits and above. Traditional DRAM with a plane transistor covers larger areas of the semiconductor substrate and cannot satisfy demands for high integration. Therefore, use of vertical transistors which can save space is a current trend in fabrication of memory cells.

When the size of the trench capacitor and the vertical transistor are shrunk due to high integration, the alignment between the active area and the deep trench becomes more important. Unfortunately, misalignment is difficult to avoid in subsequent process. Moreover, the mask used for lithography is subjected to optical limitation, such as optical proximity effect (OPE), increasing the difficulty of lithography. For example, when the light source passes through a desired trench pattern (rectangular trench pattern) on the mask onto the imaging layer, a rounding trench pattern (oval trench pattern) is formed in the imaging layer due to light diffraction.

FIG. 1 is a plane view of partial layout of the conventional mask for defining a trench pattern. The mask 10 includes rectangular transparent regions 10a to define deep trenches in a semiconductor substrate, such as a silicon wafer.

FIG. 2 is a plane view of the alignment between the active area and the trench in a semiconductor substrate. In FIG. 2, deep trenches are defined by the mask 10 shown in FIG. 1. Here, in order to simplify the diagram, only one deep trench 12 is shown. As mentioned above, OPE makes the trench 12 has an oval top view, but not a desired top view (rectangular). In addition, when the active area AA is formed, the active area AA is shifted (as the active area AA') due to misalignment. The misalignment between the active area AA' and the rounding trench 12 changes the overlapping area, shifting the threshold voltage of the vertical transistor (not shown) in the trench 12 and changing its electrical properties. That is, the alignment process window is narrowed. As a result, the yield of the memory devices is reduced. Moreover, the area of the oval trench 12 is smaller than the rectangular one, reducing the capacitor (not shown) below the vertical transistor in the trench 12.

SUMMARY OF THE INVENTION

Accordingly, an object of the invention is to provide a mask for defining a rectangular trench, wherein a single rectangular trench is defined by at least two rectangular openings.

Another object of the invention is to provide a method of forming a vertical memory device with a rectangular trench to increase the trench area and the alignment process window for the active area and the trench, thereby preventing the threshold voltage of the transistor of the vertical memory device shift and increasing the capacitance of the capacitor of the vertical memory device.

Accordingly, a mask is provided for defining a rectangular trench. The mask includes a transparent substrate and a light-shielding layer disposed thereon. The light-shielding layer has at least two rectangular opening patterns arranged with a predetermined interval to define a single trench.

The transparent substrate can be quartz and the light-shielding layer can be chromium. Moreover, the predetermined interval is about 50~70 nm. Preferably, the predetermined interval is about 60 nm.

According to another object of the invention, a method of forming a vertical memory device with a rectangular trench is also provided. First, a substrate covered by an imaging layer is provided. Next, the imaging layer is defined by a mask to form a rectangular opening, wherein the mask has at least two rectangular transparent patterns arranged with a predetermined interval. The substrate is etched using the defined imaging layer as a mask to form a single rectangular trench. Thereafter, the imaging layer is removed. Finally, a trench capacitor and a vertical transistor are successively formed in the rectangular trench to finish the vertical memory device.

The imaging layer can be photoresist. The predetermined interval is about 50~70 nm, preferably about 60 nm. Moreover, the rectangular trench has a length of about 700~800 nm and a width of about 500~600 nm.

DESCRIPTION OF THE DRAWINGS

For a better understanding of the present invention, reference is made to a detailed description to be read in conjunction with the accompanying drawings, in which.

DETAILED DESCRIPTION OF THE INVENTION

A preferred embodiment of the present invention is now described with reference to FIGS. 3, 4a~4c, and 5.

Figure 1:
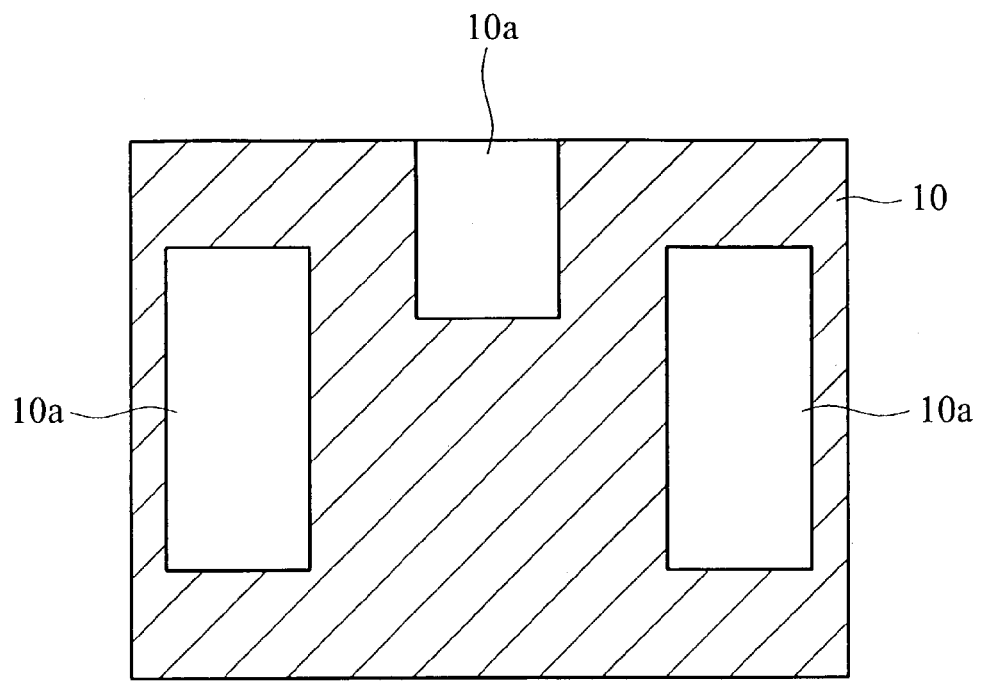
FIG. 1 is a plane view of partial layout of the conventional mask for defining a trench pattern.
Figure 2:
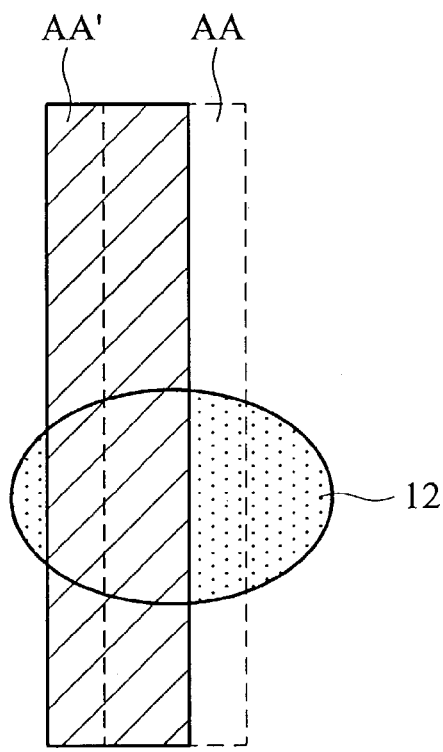
FIG. 2 is a plane view of the alignment between the active area and the trench in a semiconductor substrate.
Figure 3:
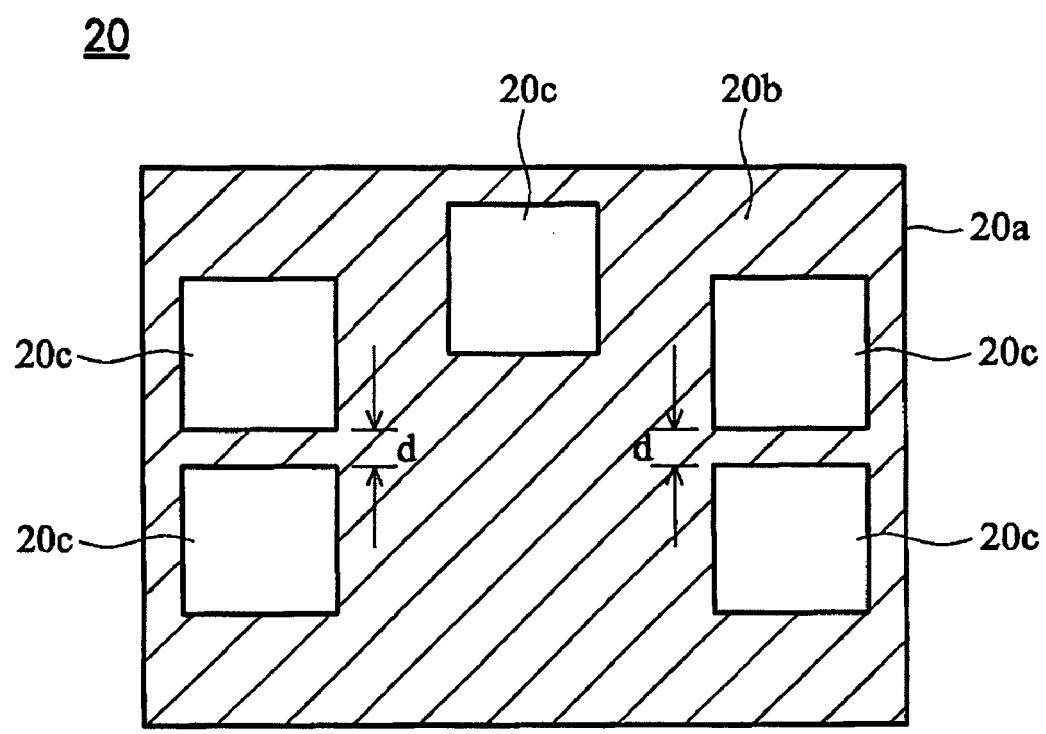
FIG. 3 is a plane view of partial layout of the mask for defining a trench pattern according to the present invention.

First, FIG. 3 is a plane view of partial layout of the mask for defining a trench pattern according to the present invention. The mask 20 includes a transparent substrate 20a and a light-shielding layer 20b thereon. In this invention, the transparent substrate 20a can be glass or quartz. The light-shielding layer 20b can be chromium and has a thickness of about 100~200 nm. In general, the light-shielding layer 20b is firstly formed on the transparent substrate 20a by conventional deposition, such as sputtering. Next, the mask 20 for defining trenches is completed after lithography and etching are successively performed on the light-shielding layer 20b to form a plurality of rectangular opening patterns 20c therein.

Compared with the prior art, one trench pattern of the invention is defined by at least two rectangular opening patterns 20c arranged with a predetermined interval d. Here, the predetermined interval d is about 50~70 nm, preferably about 60 nm. Since there is an interval d between two rectangular opening patterns 20c serving as an assistant pattern, the rounded edge of the trench pattern due to the optical proximity effect (OPE) can be avoided. That is, it can prevent formation of an oval trench (a trench with an oval top profile). In addition, it is noted that such single trench can be defined by more than two rectangular or square opening patterns where each opening pattern is arranged with a predetermined interval d.

Figure 4A:
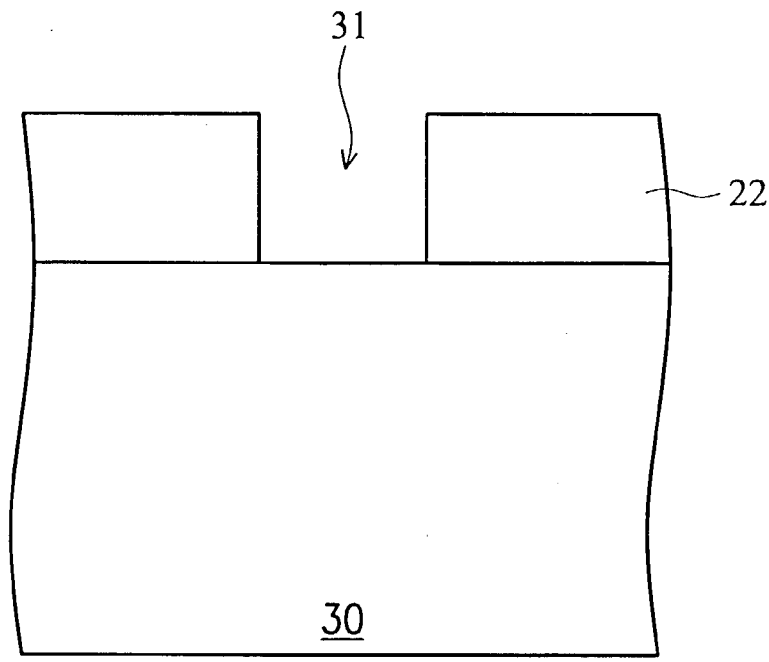
FIGS. 4a to 4c are cross-sections showing a method of forming a vertical memory device with a rectangular trench according to the present invention.
Figure 4B:
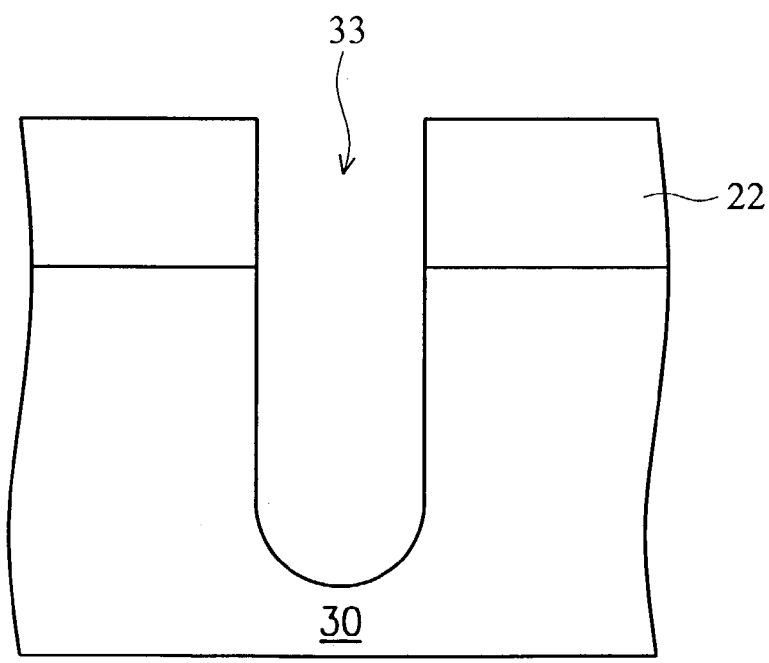
Figure 4C:
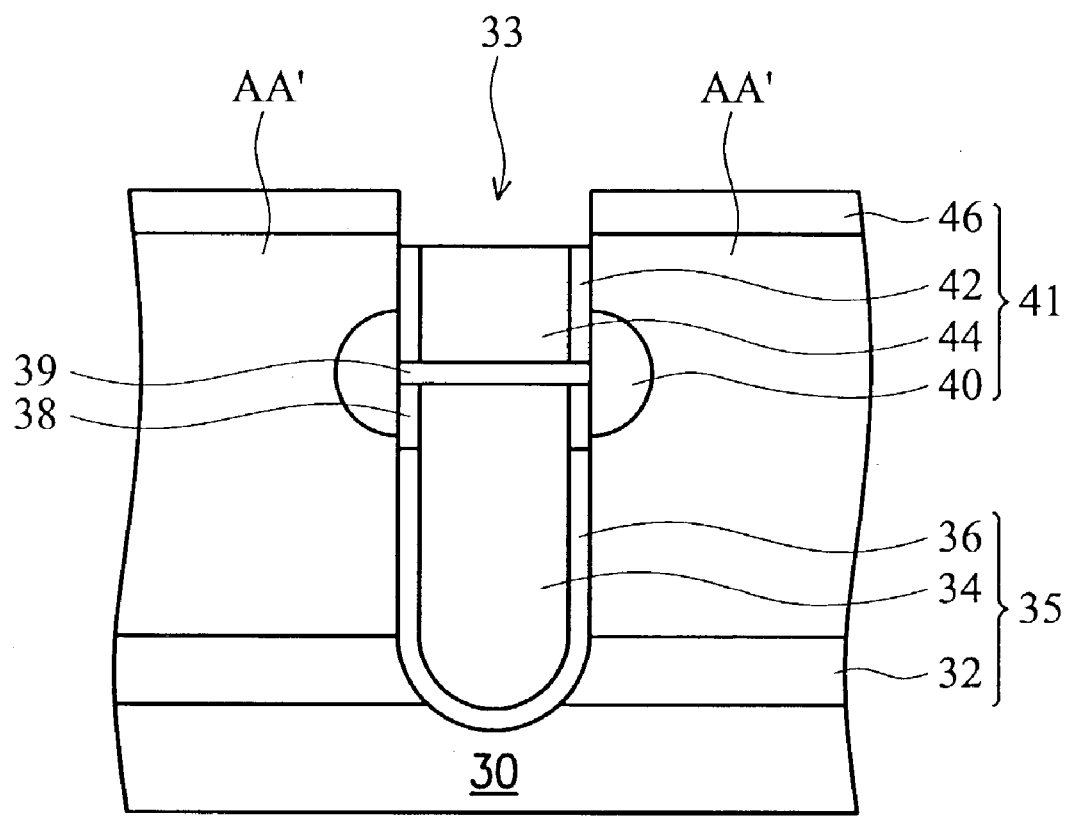

FIGS. 4a to 4c are cross-sections showing a method of forming a vertical memory device with a rectangular trench according to the present invention. First, in FIG. 4a, a substrate 30, such as a semiconductor substrate is provided. A pad oxide layer and a pad nitride layer are successively deposited on the substrate 30. Here, in order to simplify the diagram, only a blank substrate 30 is shown. Next, an imaging layer 22, such as photoresist, is coated on the substrate 30. Thereafter, lithography is performed on the imaging layer 22 using the mask 20 shown in FIG. 3 to form a rectangular opening 31 therein.

Next, in FIG. 4b, the substrate 30 is etched using the imaging layer 22 having the rectangular opening 31 as a mask to form a deep rectangular trench 33 therein. In the invention, the deep rectangular trench 33 has a length of about 700~800 nm and a width of about 500~600 nm.

Finally, in FIG. 4c, after the imaging layer 22 is removed, a trench capacitor 35 and a vertical transistor 41 are successively formed in the deep rectangular trench 33 by conventional process to finish the vertical memory device, such as dynamic random access memory (DRAM). In this memory device, the trench capacitor 35 includes a bottom electrode 32 formed in the substrate 30 near the bottom of the deep rectangular trench 33, and a top electrode 34, such as polysilicon, formed in the lower trench 33. A capacitor dielectric layer 36 is also disposed in the lower trench 33 and around the top electrode 34.

Moreover, the vertical transistor 41 includes source/drain regions 40, 46, a gate 44, and a gate dielectric layer 42. The source region 40 is formed in the active area AA' of the substrate 30 near the top of the capacitor 35 and the drain region 46 is formed near the top of the substrate 30. The gate 44, such as polysilicon, is formed in the upper trench 33. The gate dielectric layer 42, such as thermal oxide, is disposed between the source/drain regions 40, 46 and the gate 44.

An insulating layer 39, such as silicon oxide, is disposed between the gate 44 and top electrode 34 of capacitor 35 to serve as an insulator. Moreover, a collar oxide 38 is disposed over the capacitor dielectric layer 36.

Figure 5:
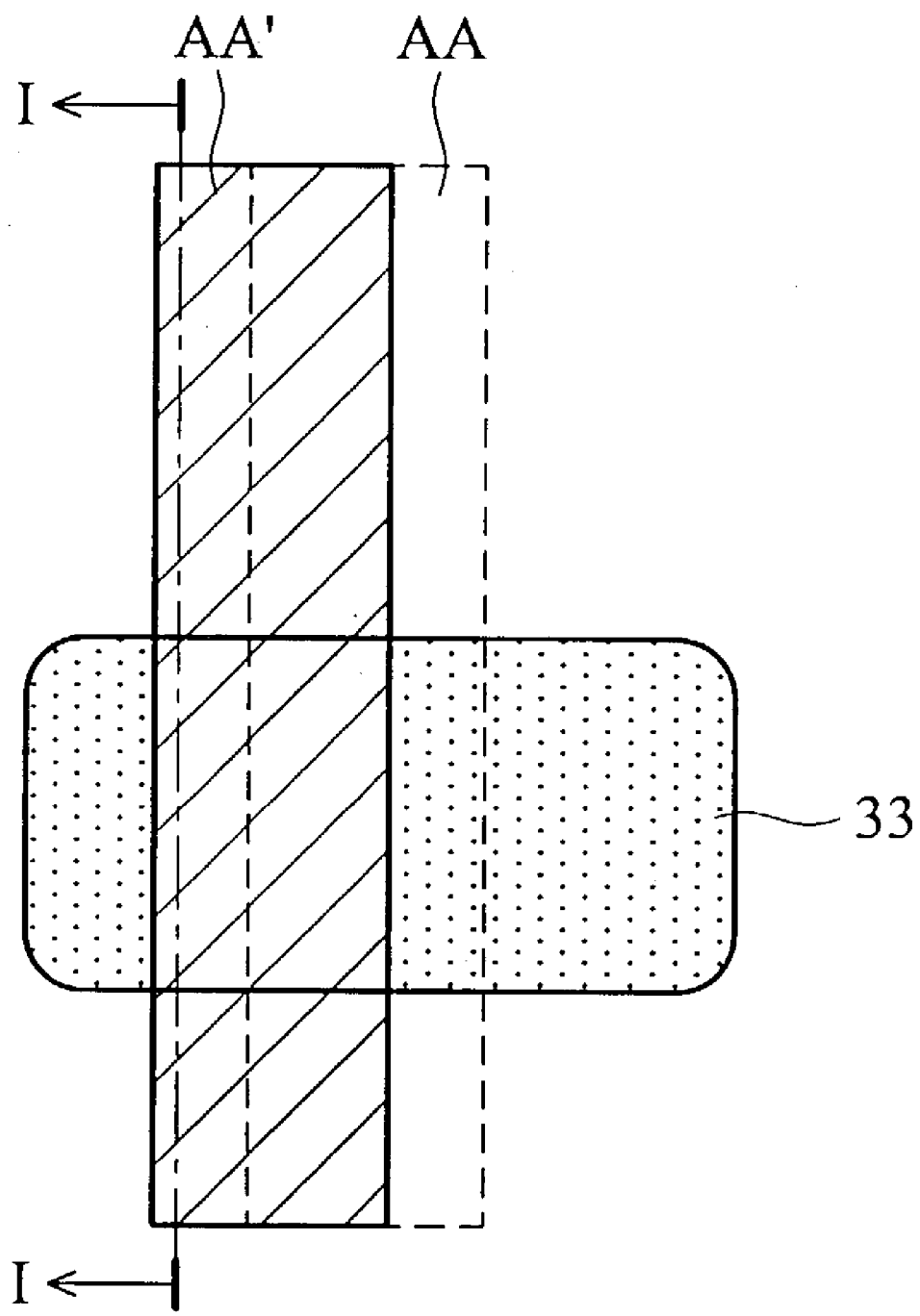
FIG. 5 is a plane view of the alignment between the active area and the trench in a semiconductor substrate according to the present invention.

FIG. 5 is a plane view of the alignment between the active area AA' and the trench 33 in the substrate 30, and FIG. 4c is also a cross-section along I—I line in FIG. 5. Since the deep trench 33 is defined by optical proximity correction using the mask 20 in FIG. 3, it has a desired rectangular top view, rather than the oval top profile shown in the prior art. Accordingly, although the active area AA shifts due to misalignment in the subsequent process, as the active area AA' shown in FIG. 5, the overlapping area between the active AA' and the deep rectangular trench 33 is not varied. That is, the threshold voltage shift of the vertical transistor can be prevented, thereby maintaining the electrical properties of the memory device and expanding the alignment process window. Moreover, the rectangular trench 33 of the invention has a larger area than the oval one in the prior art. That is, the capacitor formed in the rectangular trench 33 can has larger capacitance.

Therefore, according to the method of the invention, the yield can be increased by increasing the alignment process window. Moreover, operation speed can be raised by increasing the capacitance of the trench capacitor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mask for defining a rectangular trench, comprising:
a transparent substrate; and
a light-shielding layer, disposed on the transparent substrate and having at least two rectangular opening patterns arranged with a predetermined interval to define a single trench.

2. The mask as claimed in claim 1, wherein the transparent substrate is a quartz substrate.

3. The mask as claimed in claim 1, wherein the light shielding layer is a chromium substrate.

4. The mask as claimed in claim 1, wherein the predetermined interval is about 50~70 nm.

5. The mask as claimed in claim 1, wherein the predetermined interval is about 60 nm.

* * * * *